(12) United States Patent
Roubadia

(10) Patent No.: US 10,819,236 B2
(45) Date of Patent: Oct. 27, 2020

(54) CONTROL OF A POWER STAGE OF A SWITCHED-MODE POWER SUPPLY

(71) Applicant: STMicroelectronics (Rousset) SAS, Rousset (FR)

(72) Inventor: Regis Roubadia, Les Pennes Mirabeau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/594,662

(22) Filed: Oct. 7, 2019

(65) Prior Publication Data

US 2020/0112251 A1    Apr. 9, 2020

(30) Foreign Application Priority Data

Oct. 9, 2018  (FR) .................................... 18 59332

(51) Int. Cl.
*H02M 1/08* (2006.01)
*H02M 3/158* (2006.01)

(52) U.S. Cl.
CPC ............. *H02M 3/158* (2013.01); *H02M 1/08* (2013.01)

(58) Field of Classification Search
CPC .......... H02M 2001/0029; H02M 1/08; H02M 3/158; H03K 19/17581; H03K 5/12
See application file for complete search history.

(56) References Cited

U.S. PATENT DOCUMENTS

| 5,343,766 A | 9/1994 | Lee |
| 6,339,348 B1 | 1/2002 | Fisher |
| 9,136,760 B2 | 9/2015 | Wismar et al. |
| 10,193,448 B1 | 1/2019 | Crawley |
| 2001/0035743 A1 | 11/2001 | Feldtkeller |
| 2005/0093586 A1 | 5/2005 | Karlsson |
| 2011/0148523 A1 | 6/2011 | Deng et al. |
| 2014/0035625 A1* | 2/2014 | Hafizi ............... H04L 25/028 327/108 |
| 2014/0139160 A1 | 5/2014 | Hattori |
| 2016/0241180 A1 | 8/2016 | Suzuki |
| 2018/0062643 A1 | 3/2018 | Trescases et al. |
| 2019/0190280 A1* | 6/2019 | Chen ................. H02J 7/00 |

FOREIGN PATENT DOCUMENTS

EP    2521263 A1    11/2012

OTHER PUBLICATIONS

INPI Search Report and Written Opinion for FR 1859332 dated Jun. 13, 2019 (9 pages).

* cited by examiner

*Primary Examiner* — Thienvu V Tran
*Assistant Examiner* — Lorena D Bruner
(74) *Attorney, Agent, or Firm* — Crowe & Dunlevy

(57) ABSTRACT

A driver circuit generates a drive signal having a first and second voltage state for controlling a power transistor switch coupled to a power supply node. A control circuit operates to sense a supply voltage at the power supply node and compare the sensed supply voltage to one or more voltage thresholds. In response to the comparison, the control circuit adjusts a switching slope of the drive signal from the first voltage state to the second voltage state.

18 Claims, 3 Drawing Sheets

CONTROL OF A POWER STAGE OF A SWITCHED-MODE POWER SUPPLY

PRIORITY CLAIM

This application claims the priority benefit of French Application for Patent No. 1859332, filed on Oct. 9, 2018, the content of which is hereby incorporated by reference in its entirety to the maximum extent allowable by law.

TECHNICAL FIELD

The present disclosure generally concerns electronic circuits and, more particularly, circuits of generation of control signals for CMOS circuits. The present disclosure applies, among others, to the generation of pulse-width modulated signals for switched-mode power supplies.

BACKGROUND

The switched-mode power supplies (SMPS) to which the present disclosure relates are well known systems where a DC voltage is switched at the rate of a relatively high frequency (generally of a few MHz). The control pulses are pulse-width modulated (PWM), for example, to regulate the output voltage of the power supply.

The pulses are used to control a switch (generally a MOS power transistor) for switching the input voltage. A pulse-width modulated signal is generally generated by a comparison between a periodic ramp signal and a reference voltage. This control may transit through a control stage (driver) generally in CMOS technology.

There is a need to improve switch control circuits, particularly for a switched-mode power supply.

SUMMARY

An embodiment provides decreasing all or part of the disadvantages of know techniques of control of MOS power transistors for a switched-mode power supply.

An embodiment provides decreasing the stress imposed to transistors by switching operations.

An embodiment provides a circuit of generation of at least one signal of all-or-nothing control of a power supply switch, wherein the signal is adapted according to the value of a power supply voltage to adjust the switching slope of the switch.

According to an embodiment, the circuit comprises a plurality of amplifiers in parallel having output terminals interconnected to an output terminal of the circuit, said amplifiers being capable of being individually activated.

According to an embodiment, the number of activated amplifiers decreases as the power supply voltage increases.

According to an embodiment, each amplifier comprises two MOS transistors in series between two terminals of application of the power supply voltage.

According to an embodiment, said value of the power supply voltage is compared with thresholds to determine the number of amplifiers taking part in the control of the switch.

According to an embodiment, each amplifier is associated with a sub-circuit configured to condition the control of the amplifier between a state where its output is in high impedance and an active state.

According to an embodiment, the signal is a pulse width modulated signal.

An embodiment provides a circuit for controlling two series-assembled MOS transistors, comprising a generation circuit such as described.

An embodiment provides a converter comprising at least two switches in series between two power supply terminals and a generation circuit such as described.

According to an embodiment, the switches respectively are a P-channel MOS transistor and an N-channel MOS transistor.

According to an embodiment, a junction point of the two switches is coupled to an inductive element.

An embodiment provides a method of controlling in all or nothing a power supply switch, wherein a signal of control of the switch is adapted according to the value of a power supply voltage to adjust the switching slope of the switch.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
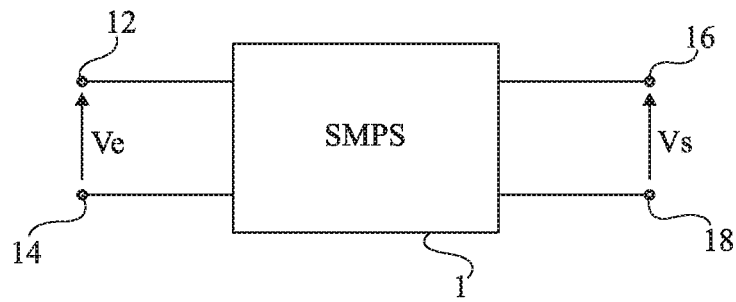
FIG. 1 very schematically shows in the form of blocks an example of a switched-mode power supply of the type to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the applications of the switched-mode power supplies controlled from the described circuit have not been detailed, the described embodiments being compatible with usual applications. Similarly, the generation of the pulse-width modulation signal to which the described circuit is applied, based on regulation control signals or others, has not been detailed, the described embodiments being here again compatible with usual circuits (microcontroller or other) of generation of such signals.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

Reference is more specifically made to an application to a circuit of control of a switch (called power switch hereafter) for switching an input voltage of a switched mode power supply. However, all that is described more generally applies to any application of control of a switch according to the power supply voltage.

FIG. 1 very schematically shows, in the form of blocks, an example of a switched-mode power supply of the type to which the described embodiments apply.

A switched-mode power supply (SMPS), symbolized in FIG. 1 by a block 1, is an element of a power converter and has the function of converting an input voltage Ve (DC), applied between two input terminals 12 and 14, into an output voltage Vs (DC), supplied between two output terminals 16 and 18. Its operation is based on the switching of one or a plurality of power switches.

Figure 2:
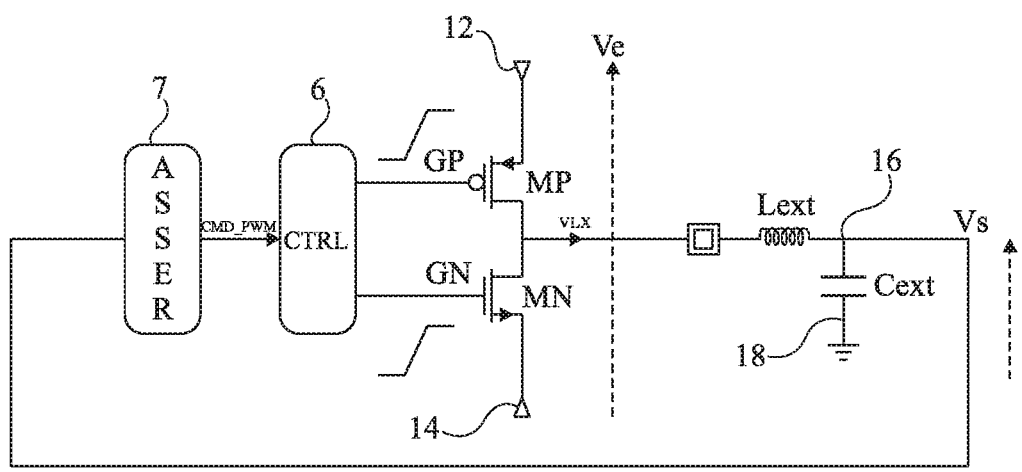
FIG. 2 very schematically and partially shows an example of a switched-mode power supply circuit.

FIG. 2 very schematically and partially shows an example of a voltage step-down switched-mode power supply circuit.

The circuit of FIG. 2 is based on an inductance Lext and two power switches MP and MN switching an input voltage Ve on inductance Lext, thus generating a current through inductance Lext, in average equal to the output current. A capacitor Cext coupling terminal 16 to ground 18 turns the current into an output voltage Vs. The value of voltage Vs is determined by the times of conduction of power switches MP and MN, which times are themselves determined by the pulse-width modulation.

Transistors MP and MN are controlled by a circuit 6 (CTRL) in pulse-width modulation. Circuit 6 generates digital signals (i.e., signals having two logic states associated with two different voltages; for example a positive voltage and a ground voltage, for all (turn on) or nothing (turn off) control) to be applied to the respective gates of transistors MP and MN. Circuit 6 receives a digital pulse signal CMD_PWM and generates, from signal CMD_PWM, two non-overlapping digital signals GP and GN of control of respective transistors MP and MN. Signal CMD_PWM is generally generated by a servo-control circuit 7 (ASSER) taking into account information representative of output voltage Vs. It is indeed preferable for signals GP and GN not to overlap to avoid a simultaneous conduction of transistors MP and MN, which would short-circuit the input voltage source. The state in which both of the two transistors MP and MN are off is, however, allowed.

Figure 3:
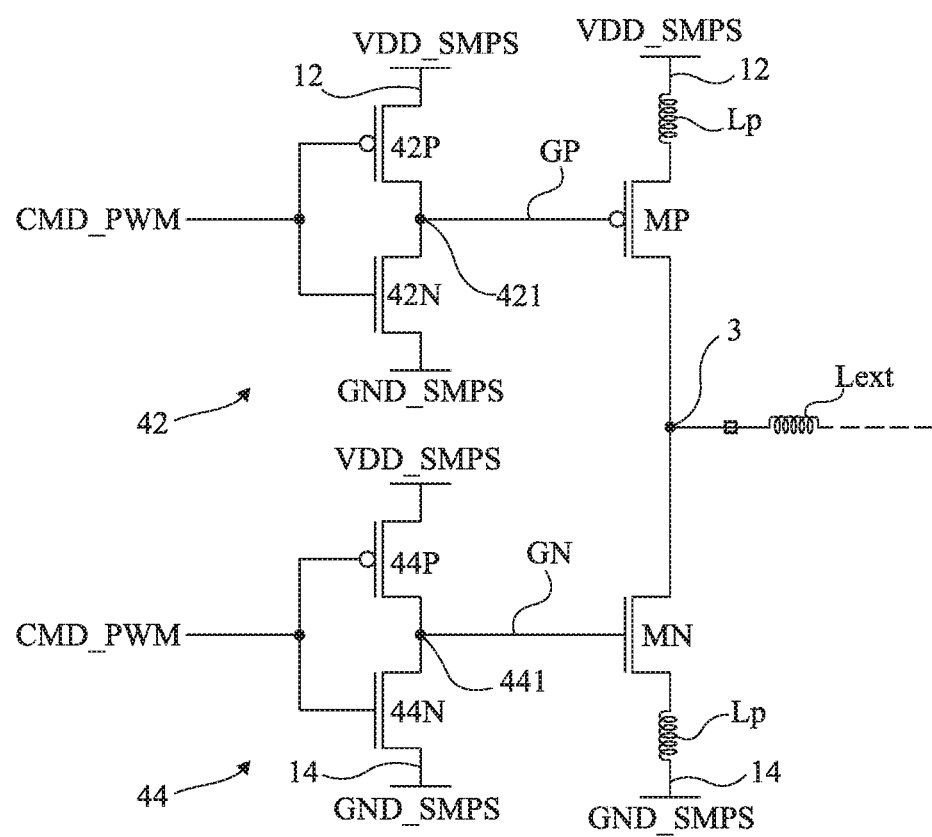
FIG. 3 very schematically shows an embodiment of power switch control amplifiers.

FIG. 3 shows an example of a circuit of generation of signals GP and GN.

Signals GP and GN are supplied by control amplifiers (drivers), respectively 42 and 44, formed in CMOS technology. Each amplifier 42, 44 is formed of a CMOS inverter formed of two transistors, respectively having a P channel, 42P, 44P, and an N channel, 42N, 44N, connected in series between terminals 12 and 14 of application of input voltage Ve, that is, of potentials VDD_SMPS and GND_SMPS of the voltage to be switched. The junction point of transistors 42P and 42N, respectively 44P and 44N, defines output 421, respectively 441, of the amplifier. Output 421, 441 is coupled to the gate, respectively GP, GN, of the power transistor to be controlled. In the example of FIG. 3, the gates of the transistors of each amplifier are interconnected and are configured to receive control signal CMD_PWM. As a variation, the control signals of the gates of transistors 42P, 42N, 44P, 44N are individualized, or grouped two by two, 42P with 44P and 42N with 44N, to guarantee that there is no simultaneous conduction of the transistors of the amplifier.

For simplification, it is considered hereafter that the gates of the CMOS inverter of each amplifier are interconnected as shown in FIG. 3. However, all that is described hereafter can easily be transposed to the case where the gates are driven by signals generated to be non-overlapping, from signal CMD_PWM. On the cut-off switch side, FIG. 3 arbitrarily depicts the example of FIG. 2 where junction point 3 of transistors MP and MN corresponds to an output terminal 3 of the electronic circuit integrating the semiconductor components, coupled to an inductive element Lext.

The switching of transistors MP and MN (typically at frequencies of a few MHz) associated with the parasitic inductances generates overvoltages. Such overvoltages adversely affect the transistors. In particular, these overvoltages can either provoke an immediate breakdown of the transistors because they are too high or an increase of the drain-source resistances of transistors MP and MN.

According to the described embodiments, it is provided to control the slope of the signals of control of transistors MP and MN according to power supply voltage VDD_SMPS. Indeed, the inventors have observed that the larger the switching slope of signal GP or GN, the larger the amplitude of the overvoltage across the corresponding transistor during switching operations.

According to the described embodiments, it is provided to take advantage of the use of CMOS circuits as control amplifiers of the power transistors. Indeed, the features of the transistors of such amplifiers condition the slope of signal GP or GN. The larger the transistors (sized to conduct a high current), the faster gate voltage GP, respectively GN, increases and reaches the switching threshold of the corresponding transistor MP of MN (i.e., the faster the switching slope). Conversely, the lower the current which is supplied (transistor 42P or 44P on) or absorbed (transistor 42N or 44N on), the smaller the switching slope.

It could have been devised to size amplifiers 42 and 44 for a slope sized for the worst case, that is, sufficiently low whatever the value of voltage VDD_SMPS. This would however adversely affect the low-voltage operation since switching then risks being too slow while, under a low voltage, faster switching operations are required in order to ensure the power transfer. Indeed, below a given value of the slope, under low power voltage, the power stage of the SMPS is no longer operational.

Figure 4:
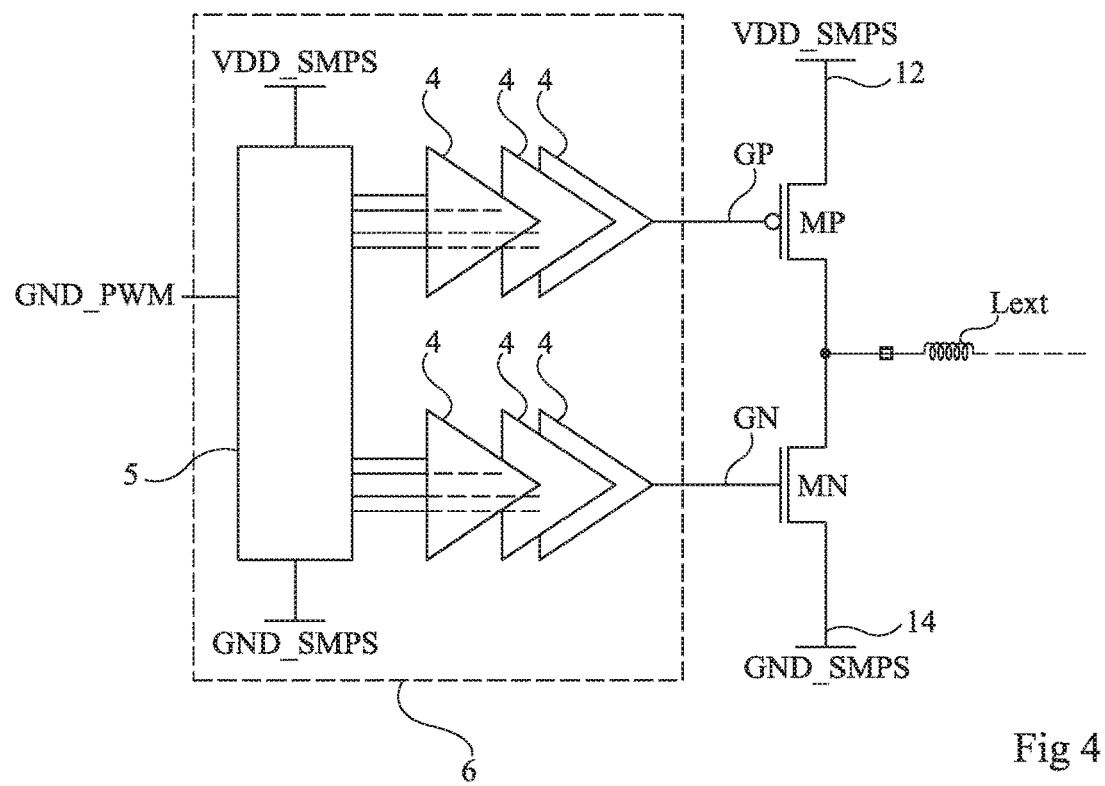
FIG. 4 very schematically shows in the form of blocks an embodiment of a circuit of generation of power switch control signals.

FIG. 4 very schematically shows in the form of blocks an embodiment of a circuit 6 of generation of power switch control signals GP and GN.

Although the embodiment of FIG. 4 applies to the case of a switched-mode power supply such as shown in FIG. 2, all that will be described transposes to a circuit of generation of a power transistor gate control signal of variable slope according to the power supply voltage.

It shows the two power transistors MP and MN in series between terminals 12 and 14 of application of voltage VDD_SMPS to be switched (for simplification, a zero potential GND_SMPS is assumed, so that voltage VDD_SMPS GND_SMPS to be switched has the value of potential VDD_SMPS).

According to the embodiment of FIG. 4, signals GP and GN of control of the gates of power switches MP and MN are generated by a circuit 6 comprising a plurality of amplifiers 4 (drivers) in parallel. Amplifiers in parallel means that all the amplifiers are powered with a same voltage (VDD_SMPS) and that their output terminals are interconnected. According to the described embodiments, the input terminals of the amplifiers are however not interconnected, but are individually controllable. Amplifiers 4 are formed of CMOS inverters individually controlled by a circuit 5 receiving control signal CMD_PWM.

The function of circuit 5 is to estimate the value of power supply voltage VDD_SMPS and to activate (control) a different number of amplifiers according to this value. Preferably, circuit 5 compares voltage VDD_SMPS with a number of thresholds. The number of thresholds is a function of the number of amplifiers 4. In practice, the number of thresholds corresponds to the number of amplifiers minus one. Thus, circuit 5 controls or activates an increasing number of amplifiers as voltage VDD_SMPS decreases from threshold to threshold and, conversely, controls a decreasing number of amplifiers as voltage VDD_SMPS increases from threshold to threshold. The signals which control each of amplifiers 4 remains in an all or nothing characteristic (such as having two logic states, one state for turning on and another state for turning off), the variation of the switching slope of transistor MP or MN being obtained by the variation of the current supplied by the amplifiers in parallel according to the number of active amplifiers.

Preferably, circuit 5 generates signals for controlling amplifiers 4 to obtain non-overlapping signals GP and GN and thus avoids a simultaneous conduction. Such a feature is, for example, obtained by logic and delay functions applied to signal CMD_PWM to generate the two control signals of transistors MP and MN with the required non-overlapping condition.

Figure 5:
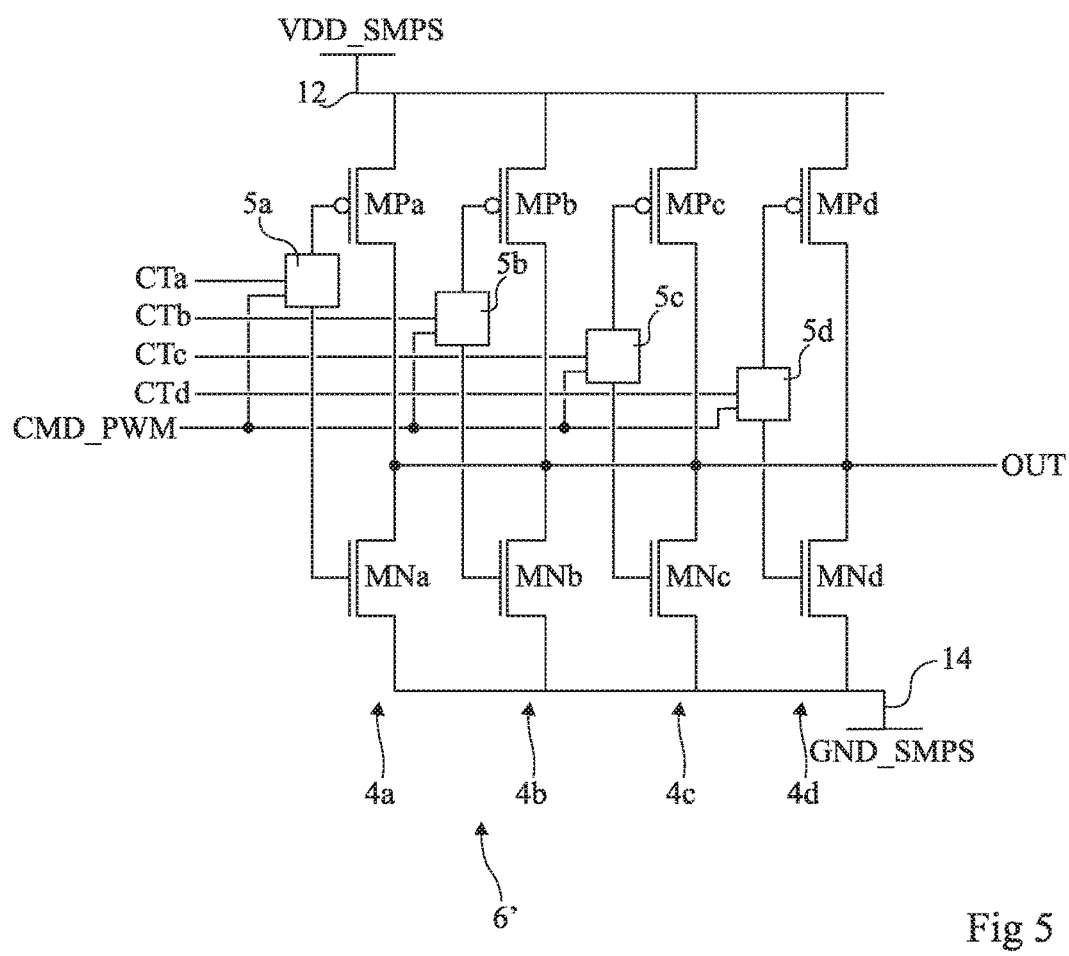
FIG. 5 partially shows an embodiment of a circuit of generation of a signal having a switching slope variable according to the power supply voltage.

FIG. 5 partially shows an embodiment of a circuit 6' of generation of a signal OUT having a switching slope variable according to power supply voltage VDD_SMPS.

Circuit 6' of FIG. 5, for example, corresponds to half of circuit 6 of FIG. 4 to generate one of signals GP or GN.

An embodiment where four amplifiers 4a, 4b, 4c, and 4d are used to have four possible slopes for the signal generated at output OUT of circuit 6' is assumed.

Each amplifier 4 is based on a CMOS circuit formed of a P-channel MOS transistor, MPa, MPb, MPc, MPd series connected with an N-channel MOS transistor MNa, MNb, MNc, MNd, between terminals 12 and 14. The junction points of the (four) series associations are interconnected to output terminal OUT. In the example of FIG. 5, the gates of the two transistors of each amplifier 4 are coupled to an activation sub-circuit 5a, 5b, 5c, 5d of this amplifier. Each sub-circuit 5a to 5d receives from circuit 5 (FIG. 4, not shown in FIG. 5) signal CMD_PWM and a signal, respectively CTa, CTb, CTc, and CTd with two states of activation of the corresponding amplifier. The function of each sub-circuit 5a to 5d is, according to the state of the corresponding signal CT, to turn off the two transistors of the concerned amplifier 4 to place its output in high impedance, or to apply signal CMD_PWM (or information representative thereof in case of the generation of non-overlapping signals) to the gates of the two transistors of the amplifier. Thus, all the amplifiers 4 which are activated are controlled in the same way by signal CMD_PWM.

As a variation, circuit 5 directly generates individual signals of control of the gates of the transistors of all amplifiers 4.

Preferably, the transistors of all amplifiers 4 have identical surface area ratios (gate width/length) to each bring a similar current contribution to the output signal. If, however, different surface ratios are provided from one amplifier to the other, the generation of the activation signals should be adapted accordingly.

According to a specific embodiment, voltage VDD_SMPS is provided to be able to vary between approximately 2 and approximately 3.5 volts. In this case, three comparison thresholds, respectively at 2.4 volts, 2.8 volts, and 3.2 volts may be provided and the control signals may be generated so that:
 a single amplifier 4 is activated if voltage VDD_SMPS is greater than 3.2 volts;
 two amplifiers are activated if voltage VDD_SMPS is in the range from 2.8 to 3.2 volts;
 three amplifiers are activated if voltage VDD_SMPS is in the range from 2.4 to 2.8 volts; and
 four amplifiers are activated if voltage VDD_SMPS is smaller than 2.4 volts.

The circuit 5 receives the voltage VDD_SMPS for comparison against the comparison thresholds and in response to the comparison generates the logic states of the CTa, CTb, CTc, and CTd signals for controlling enabling of the four amplifiers 4a, 4b, 4c, and 4d.

The number of amplifiers depends on the desired adjustment accuracy for the switching slope of the power supply voltage cut-off switches.

An advantage of the described embodiments is that they enable to avoid harmful overvoltages upon switching of the switched-mode power supply.

Another advantage of the described embodiments is that they require no modification at the level of the cut-off switches. They are thus compatible with usual architectures.

Another advantage of the described embodiments is that they require no modification of control signal CMD_PWM. Thus, the described embodiments are compatible with existing control architectures.

Another advantage of the described embodiments is that they are compatible with the generation of non-overlapping control signals.

Various embodiments and variations have been described. It will be understood by those skilled in the art that certain features of these various embodiments and variations may be combined, and other variations will occur to those skilled in the art. In particular, even of the disclosed embodiments describe as an example a signal CMD_PWM having a fixed frequency and a variable duty cycle, these embodiments also apply to signals of variable frequency (PFM).

Finally, the practical implementation of the described embodiments and variations is within the abilities of those skilled in the art based on the functional indications given hereabove. In particular, the selection of the thresholds, of the number of amplifiers 4, as well as the sizing of the transistors of amplifiers 4, is within the abilities of those skilled in the art according to the application and to the provided functional indications.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:
1. A circuit, comprising:
 a driver circuit configured to generate a drive signal having a first voltage state and a second voltage state for controlling a power transistor switch coupled to a power supply node; wherein the driver circuit com- prises a plurality of amplifiers connected in parallel and having output terminals interconnected to generate the drive signal; and a control circuit configured to sense a supply voltage at the power supply node, compare the sensed supply voltage to one or more voltage thresholds, and adjust a switching slope of the drive signal from the first voltage state to the second voltage state in response to said comparison; wherein the plurality of amplifiers are configured for individual activation in response to the control circuit to control a number of the amplifiers that are activated in response to said comparison so as to set the switching slope of the drive signal; and wherein the number of amplifiers that are activated by the control circuit decreases as the supply voltage at the power supply node increases.

2. The circuit of claim 1, wherein each amplifier comprises two MOS transistors connected in series between the power supply node and a ground node.

3. The circuit of claim 2, wherein each amplifier is associated with a sub-circuit configured to condition the control of the amplifier between a state where its output is in high impedance and an active state.

4. The circuit of claim 1, wherein the drive signal is a pulse-width modulated signal.

5. The circuit of claim 1, further comprising a further power transistor connected in series with said power transistor between the power supply node and a ground node.

6. The circuit of claim 5, wherein the power transistor is one of a P-channel MOS transistor and an N-channel MOS transistor, and wherein the further power transistor is the other of the P-channel MOS transistor and the N-channel MOS transistor.

7. The circuit of claim 6, wherein a junction point between the further power transistor connected in series with said power transistor is coupled to an inductive element.

8. A circuit, comprising:
a driver circuit configured to generate a drive signal having a first voltage state and a second voltage state for controlling a power transistor switch coupled to a power supply node; wherein the driver circuit comprises a plurality of amplifiers connected in parallel and having output terminals interconnected to generate the drive signal; and a control circuit configured to sense a supply voltage at the power supply node and adjust a switching slope of the drive signal from the first voltage state to the second voltage state in response to the sensed supply voltage at the power supply node; wherein the plurality of amplifiers are configured for individual activation in response to the control circuit to control a number of the amplifiers that are activated in response to the sensed supply voltage at the power supply node so as to set the switching slope of the drive signal; and wherein the number of amplifiers that are activated by the control circuit decreases as the supply voltage at the power supply node increases.

9. The circuit of claim 8, wherein each amplifier comprises two MOS transistors connected in series between the power supply node and a ground node.

10. The circuit of claim 9, wherein each amplifier is associated with a sub-circuit configured to condition the control of the amplifier between a state where its output is in high impedance and an active state.

11. The circuit of claim 8, wherein the drive signal is a pulse-width modulated signal.

12. The circuit of claim 8, further comprising a further power transistor connected in series with said power transistor between the power supply node and a ground node.

13. The circuit of claim 12, wherein the power transistor is one of a P-channel MOS transistor and an N-channel MOS transistor, and wherein the further power transistor is the other of the P-channel MOS transistor and the N-channel MOS transistor.

14. The circuit of claim 13, wherein a junction point between the further power transistor connected in series with said power transistor is coupled to an inductive element.

15. A method, comprising:
sensing a supply voltage at a power supply node; comparing the sensed supply voltage to one or more voltage thresholds; and adjusting a switching slope of a drive signal from a first voltage state to a second voltage state in response to said comparison, wherein adjusting the switching slope comprises selectively activating a number of amplifiers of a plurality of amplifiers connected in parallel to generate the drive signal in response to said comparison so as to set the switching slope of the drive signal, and wherein the number of amplifiers that are activated decreases as the supply voltage at the power supply node increases; wherein the drive signal is applied for controlling a power transistor switch coupled to the power supply node.

16. The method of claim 15, wherein the drive signal is a pulse-width modulated signal.

17. A method, comprising:
sensing a supply voltage at a power supply node; and adjusting a switching slope of a drive signal from a first voltage state to a second voltage state in response to said sensed supply voltage, wherein adjusting the switching slope comprises selectively activating a number of amplifiers of a plurality of amplifiers connected in parallel to generate the drive signal in response to said sensing so as to set the switching slope of the drive signal, and wherein the number of amplifiers that are activated decreases as the supply voltage at the power supply node increases; wherein the drive signal is applied for controlling a power transistor switch coupled to the power supply node.

18. The method of claim 17, wherein the drive signal is a pulse-width modulated signal.

* * * * *